United States Patent [19]
Przybysz et al.

[11] Patent Number: 5,798,722
[45] Date of Patent: Aug. 25, 1998

[54] UHF DIGITAL TO ANALOG CONVERTER FOR CRYOGENIC RADAR SYSTEM

[75] Inventors: John Xavier Przybysz, Pittsburgh; Donald Lynn Miller, Export, both of Pa.

[73] Assignee: Northrop Grumman Corporation, Los Angeles, Calif.

[21] Appl. No.: 799,819

[22] Filed: Feb. 13, 1997

[51] Int. Cl.$^6$ .................................................. H03M 1/66
[52] U.S. Cl. ........................................ 341/133; 341/144
[58] Field of Search .................................. 341/133, 134

[56] References Cited

U.S. PATENT DOCUMENTS

| | | | |
|---|---|---|---|
| 4,344,052 | 8/1982 | Davidson | 333/222 |
| 4,496,854 | 1/1985 | Chi et al. | 307/306 |

OTHER PUBLICATIONS

"Fundamentals of Giaever and Josephson Tunneling", Y. Bruynseraede, C. Vlekken, C. Van Haesendonck and V.V. Moshchalkov, *The New Superconducting Electronics*, Kluwer Academic Publishers., pp. 1–28.

"Superconducting–Normal–Superconductor Junctions for Digital/Analog Converters", S.P. Benz, National Institute of Standards and Technology, Boulder, CO 80303.

"Josephson Voltage Standard –A Review", Clark A. Hamilton, Charles J. Burroughs and Samuel P. Benz, National Institute of Standards and Technology, Boulder, CO 80303.

*Primary Examiner*—Marc S. Hoff

[57] ABSTRACT

Frequency output capability of a Josephson junction digital to analog converter is increased by applying a digital data stream to a Josephson junction array including a low impedance tap in the form of a metal line of microstrip running across the top of and insulated from the array. The input end of the array and one end of the tap are commonly connected to a digital data stream source. A differential output signal is coupled from the Josephson junction array to a bandpass filter which extracts a predetermined RF frequency by means of an impedance matching transformer including a primary winding having one end coupled to the output end of the array and whose other end is coupled to the input end of the array through the low impedance tap.

22 Claims, 5 Drawing Sheets

FIG. 5
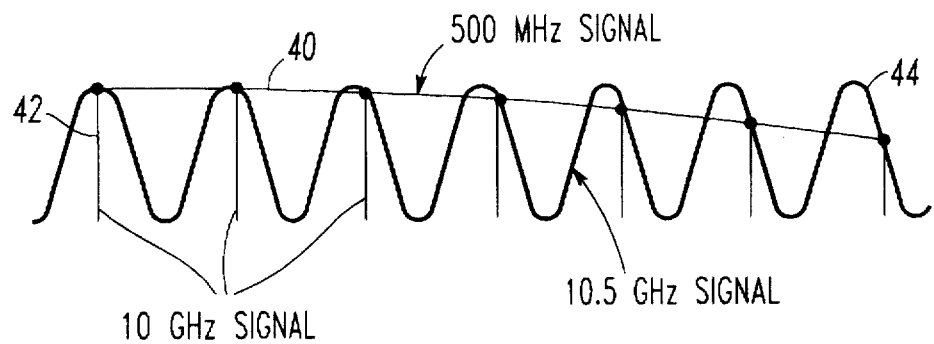
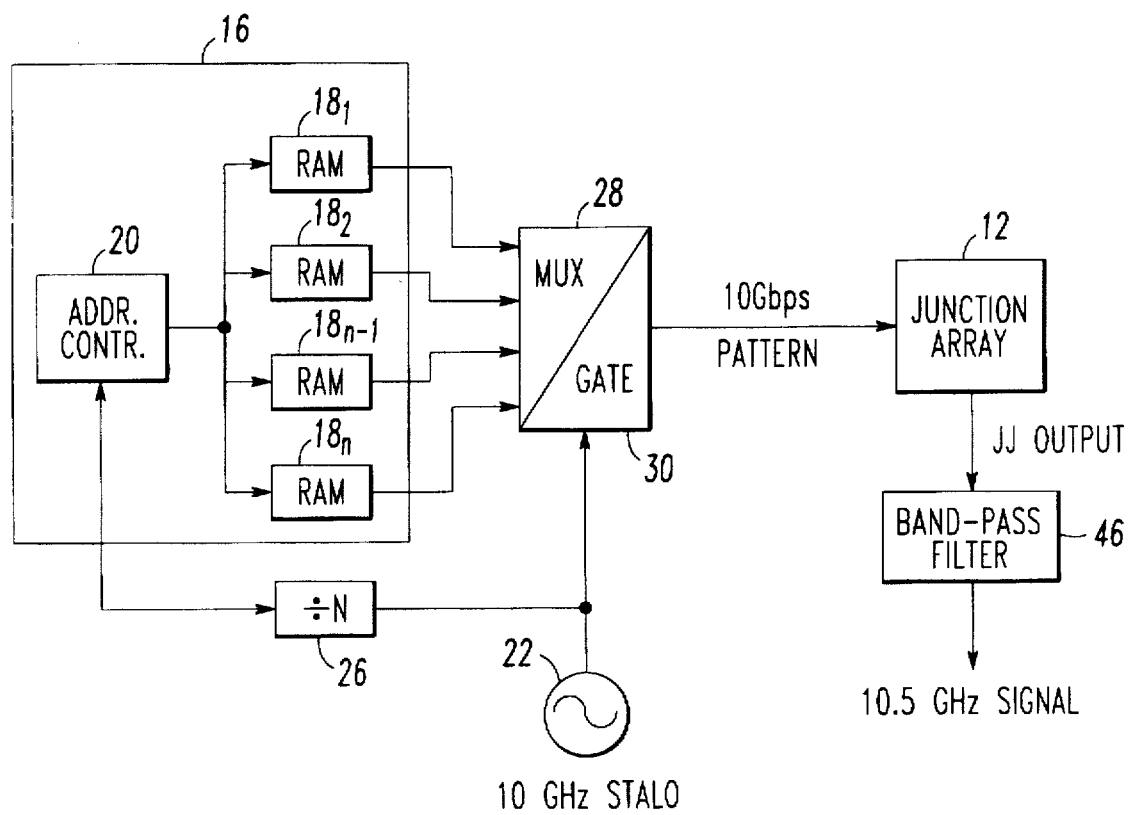
FIG. 6

UHF DIGITAL TO ANALOG CONVERTER FOR CRYOGENIC RADAR SYSTEM

CROSS REFERENCE TO RELATED APPLICATIONS

This application is related to U.S. Ser. No. 08/861,732 (RDS-95-038), entitled "Cryogenic Radar System Including Josephson Junction Digital To Analog Converter", filed in the names of John X. Przybysz et al on May 12, 1997; U.S. Ser. No. 08/854,856, (RDS-96-004), entitled "High-Power Waveform Generator", filed in the names of John X. Przybysz et al on May 12, 1997; and U.S. Ser. No. 08/799,820 (RDS-96-006), entitled "Direct X-Band Waveform Generator", filed in the names of John X. Przybysz et al on Feb. 13, 1997. These applications are assigned to the assignee of the present invention and are intended to be specifically incorporated herein by reference.

BACKGROUND OF THE INVENTION

1. Field of the Invention

This invention relates generally to digital to analog converters and more particularly to a digital to analog converter operating at ultra high frequencies (UHF) and utilizing Josephson junctions.

2. Description of Related Art

Josephson junctions are well known devices consisting of two superconductors separated by a thin film of dielectric material or normal metal. Such devices are typically comprised of superconducting layers of Nb separated by $Al_2O_3$ or superconducting layers of $YBa_2CU_3O_7$ separated by Co doped $YBa_2Cu_3O_7$. Josephson junctions produce quantum mechanically accurate voltage pulses generated as a result of phase slips in the quantum wave function of the superconductor system. This is accomplished by exploiting the now well known Josephson effect which is characterized by absolutely repeatable constant voltage steps in the junction's current-voltage characteristic. For a detailed treatment of Josephson junctions, one can refer to a publication entitled, A New Superconducting Electronics, Ed. by Harold Weinstock and Richard W. Ralston, (ISBN 0-7923-2515-X) Kluwer Academic Publishers, 1993.

In the above-noted related application U.S. Ser. No. 08/861,732 (RDS-95-038), there is disclosed a low phase-noise waveform generator for generating X-band signals utilizing a Josephson junction array. There the array is excited by a digital data stream incorporating a predetermined frequency spectrum. The Josephson junction array outputs a digital data stream having pulses of quantum mechanically accurate uniform amplitude. These pulses are fed to a low-pass analog signal filter which operates to retrieve analog signals having frequencies of the frequency spectrum in the digital data stream. By feeding the analog signals to a mixer along with a low phase-noise local oscillator generating a fixed frequency, a low phase-noise RF signal is generated which can be used for generating the transmit signals in a radar system so that enhanced detection of targets in "clutter" can be obtained.

SUMMARY

Accordingly, it is an object of the present invention to provide an improvement in the generation of low phase-noise RF signals.

It is another object of the invention to generate low phase-noise RF signals in the UHF frequency range.

It is a further object of the invention to provide a waveform generator which includes a Josephson type digital to analog converter.

The foregoing and other objects are achieved by a method and apparatus for increasing the frequency output capability of a Josephson junction digital to analog converter by applying a digital data stream to a Josephson junction array including a low impedance tap in the form of a metal line of microstrip running across the top of and insulated from the array. The input end of the array and one end of the tap are commonly connected to a digital data stream source. A differential output signal is coupled from the Josephson junction array to a bandpass filter which extracts a predetermined RF frequency by means of an impedance matching transformer including a primary winding having one end coupled to the output end of the array. The other end of the primary winding is coupled to the input end of the array via a series connection with the low impedance tap. Such a configuration enables a maximum power transfer and a signal having a high signal-to-noise ratio to be fed to a conventional 50 ohm load from relatively low impedance Josephson junctions.

Further scope of applicability of the present invention will become apparent from the detailed description provided hereinafter. It should be understood, however, that the detailed description and specific examples, while indicating preferred embodiments of the invention, are provided by way of illustration only, since various changes, alterations and modifications coming within the spirit and scope of the invention will become apparent to those skilled in the art.

BRIEF DESCRIPTION OF THE DRAWINGS

The present invention will also become more fully understood when considered together with the accompanying drawings which are provided by way of illustration only and thus are not limitative thereto, and wherein:

FIG. 5 is illustrative of the current waveforms in the first and last Josephson junctions in the array shown in FIG. 1; and FIG. 6 is a depiction of the output waveform from the bandpass filter shown in FIG. 1.

DETAILED DESCRIPTION OF THE INVENTION

Figure 1:
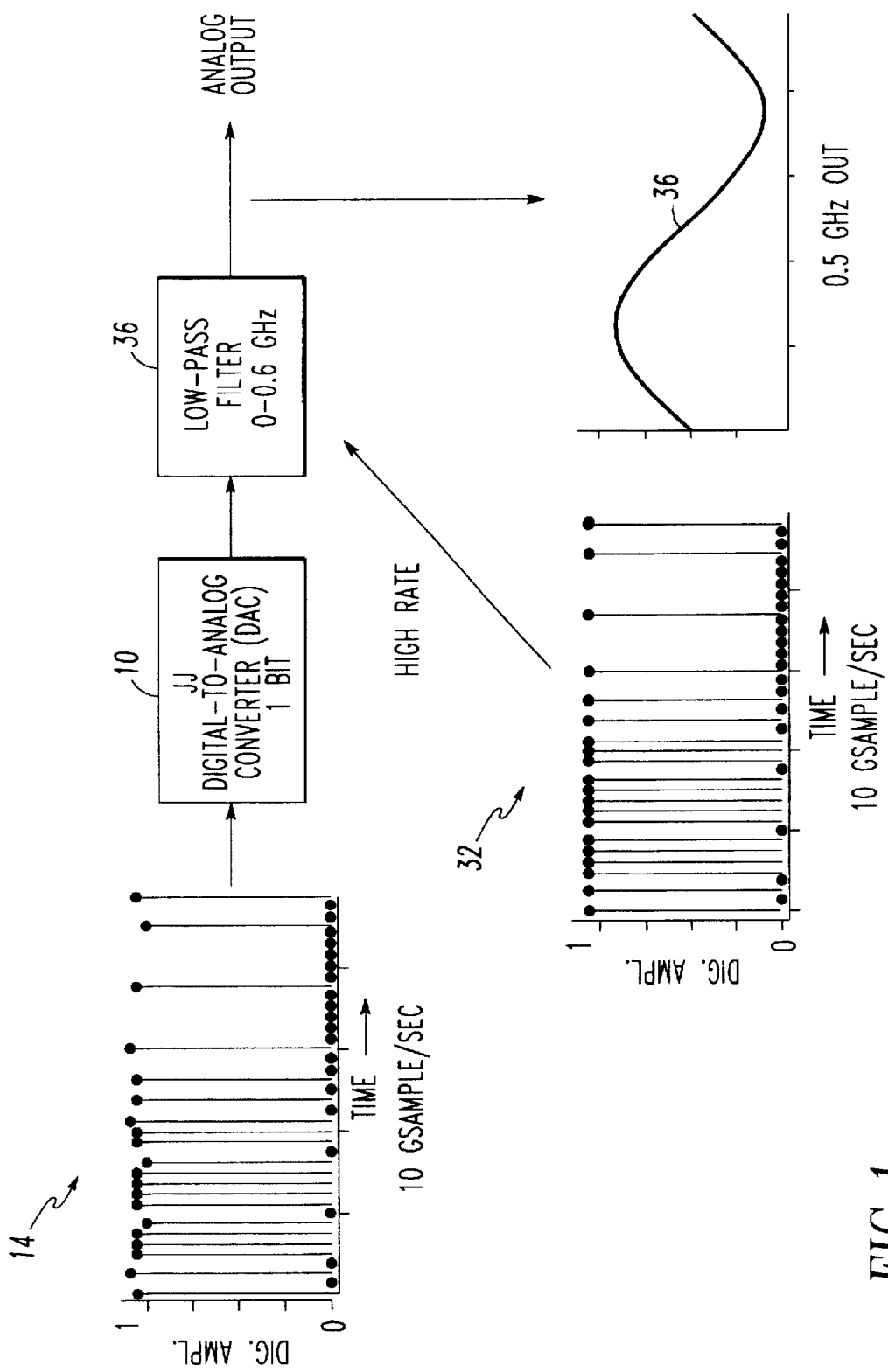
FIG. 1 is an electrical schematic diagram illustrative of the preferred embodiment of the invention.

Referring now to the drawings wherein like reference numerals refer to like elements throughout and more particularly to FIG. 1, reference numeral 10 denotes a series connected Josephson junction array having an input end and an output end signified by circuit nodes 12 and 14, respectively. Further as shown, the input circuit node 12 is connected to a Josephson junction excitation source 16, to be subsequently described, while the output node 14 is terminated by a resistance 18 coupled to ground. When the array 10 is excited by the source 16 and the output end, i.e. node 14 is terminated, for example, by a grounded resistance 18, a differential output signal consisting of pulses having a quantum mechanically accurate identical amplitude will appear across the nodes 12 and 14. In the present invention, the differential output signal is coupled from the array 10 by means of a low impedance tap 20 and an impedance matching transformer 22. The tap 20 comprises an element such as a microstrip transmission line fabricated on top of the Josephson junction array while being insulated therefrom. As shown in FIG. 1, one end of the tap 20 is commonly connected at circuit node 12 to the input side of the array 10 while its other end is coupled to the transformer 22.

The transformer 22 is shown consisting of a primary winding 24 and a secondary winding 26. One end (+) of the primary winding 24 is connected to one end of the low impedance tap 20. The other end (−) of the primary winding 24 is shown connected back to the output end of the Josephson junction array 10 at circuit node 14. The secondary winding 26, on the other hand, is connected at one end to a bandpass filter 28, while its opposite end is connected to ground. The transformer 22 acts to convert the low impedance, typically 0.4 ohms, of the Josephson junction array 10, for example, to 50 ohms, thus enabling the use of conventional bandpass filters.

Figure 2:
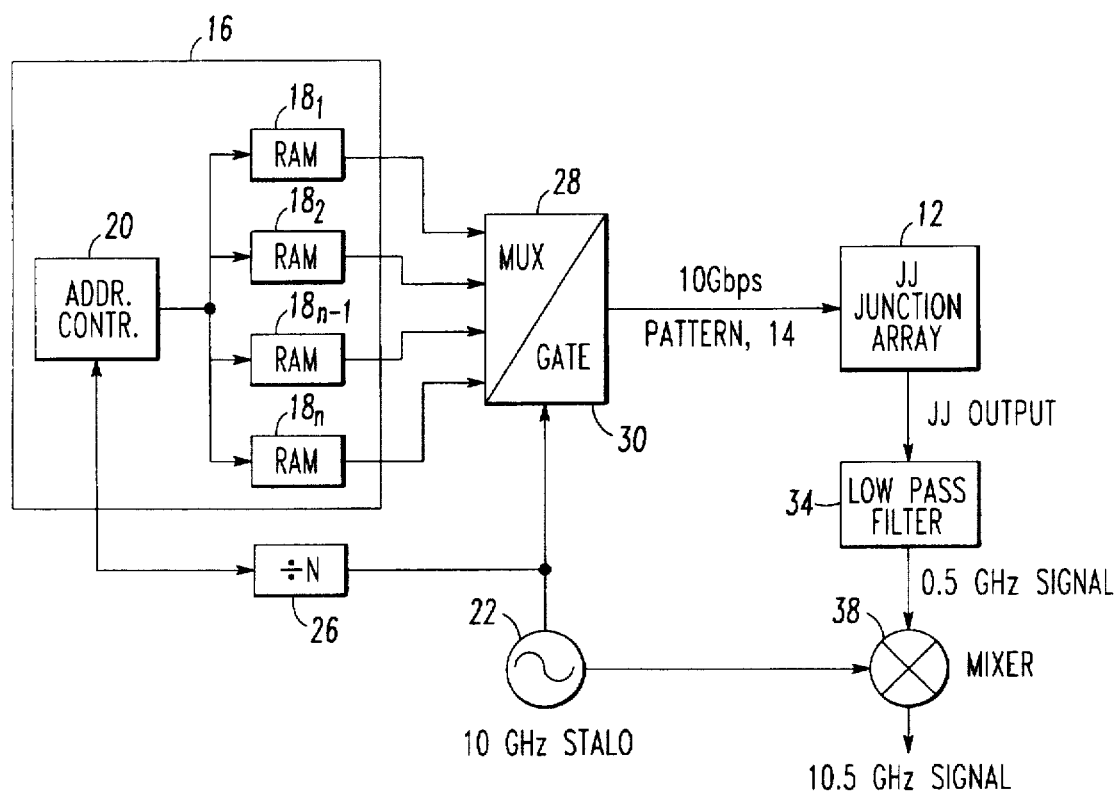
FIG. 2 is a transverse section of side view illustrating the structural features of the low impedance differential tap overlaying a Josephson junction array shown schematically in FIG. 1.

As shown in FIG. 2, tap 20 comprises a metal line which is narrower than the Josephson junction array 10 and being separated therefrom by a layer of dielectric insulation 30. The Josephson junction array 10 comprises a line array of Josephson junctions 32 each comprised of a base electrode 34, a barrier layer 36, and a counter electrode 38 formed on a substrate 40 located on a ground plane 42. The method of fabricating such a structure is well known.

Since the line of metallization forming the tap 20 is narrower than the line of Josephson junctions 10, an exciter signal applied to circuit node 12 from the exciter 16 flows through the Josephson junction array 10 rather than the tap 20 and thus exhibits high common mode impedance.

Figure 3:
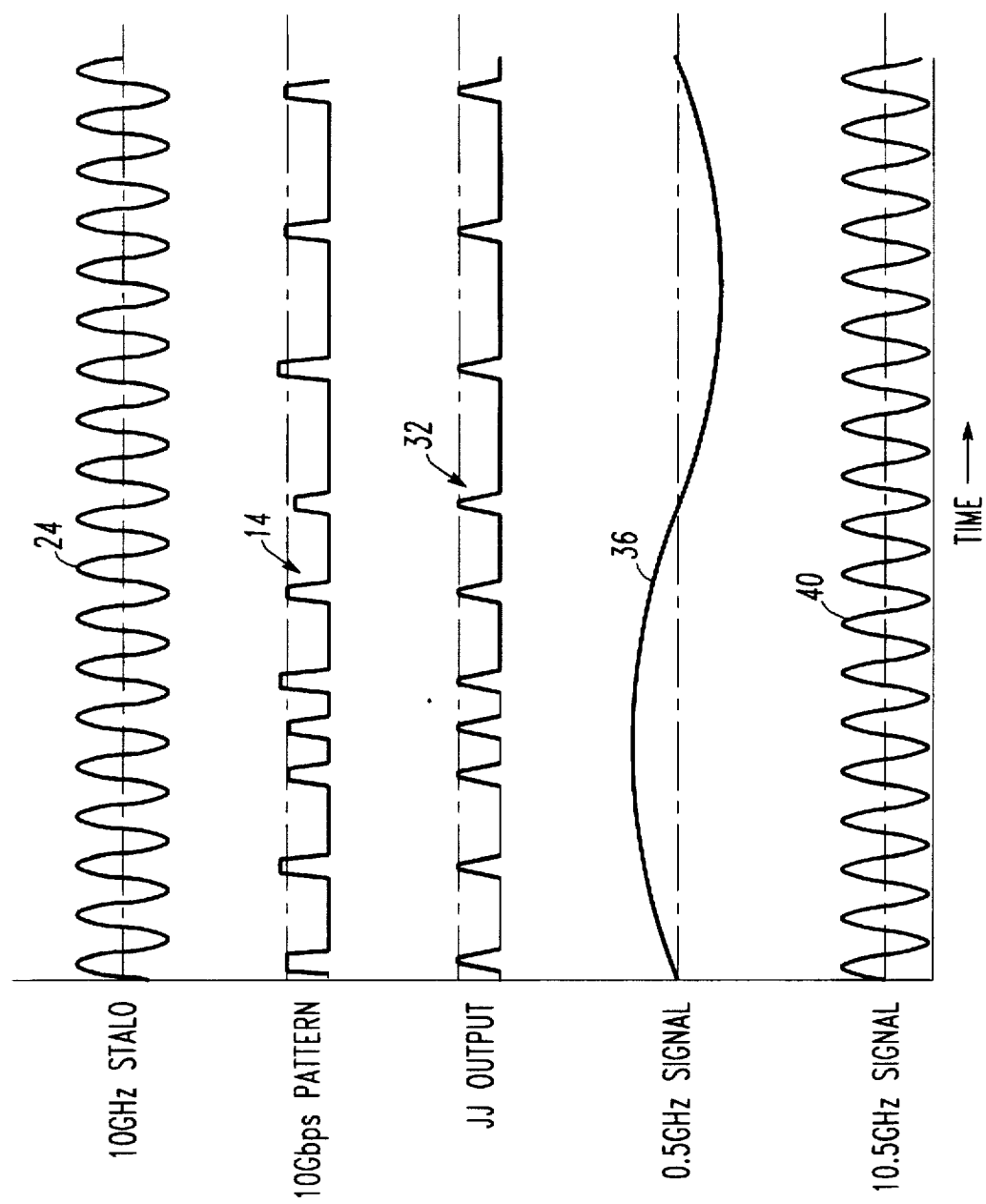
FIG. 3 is an electrical equivalent circuit of the Josephson junction array and the low impedance differential tap overlaying the Josephson junction array shown schematically in FIG. 1.

The equivalent circuit of the Josephson junction array 10 and the tap structure 20 is shown in FIG. 3. There a plurality of series connected inductances 44 represent the metal line forming the tap 20. The Josephson junction array 10 is shown consisting of a plurality of Josephson junctions $32_2 \ldots 32_n$ which are connected together in series and are each represented by a fixed resistor 46 and a series inductor 48. Furthermore, the tap 20 is separated from the Josephson array 10 by a distributed capacitance which is represented by a plurality of capacitors 50 appearing between circuit nodes 52 and 54. The array 10, moreover, is also shown including a distributed capacitance to ground potential as represented by a plurality of capacitors 56 appearing between circuit nodes 54 and ground.

Figure 4:
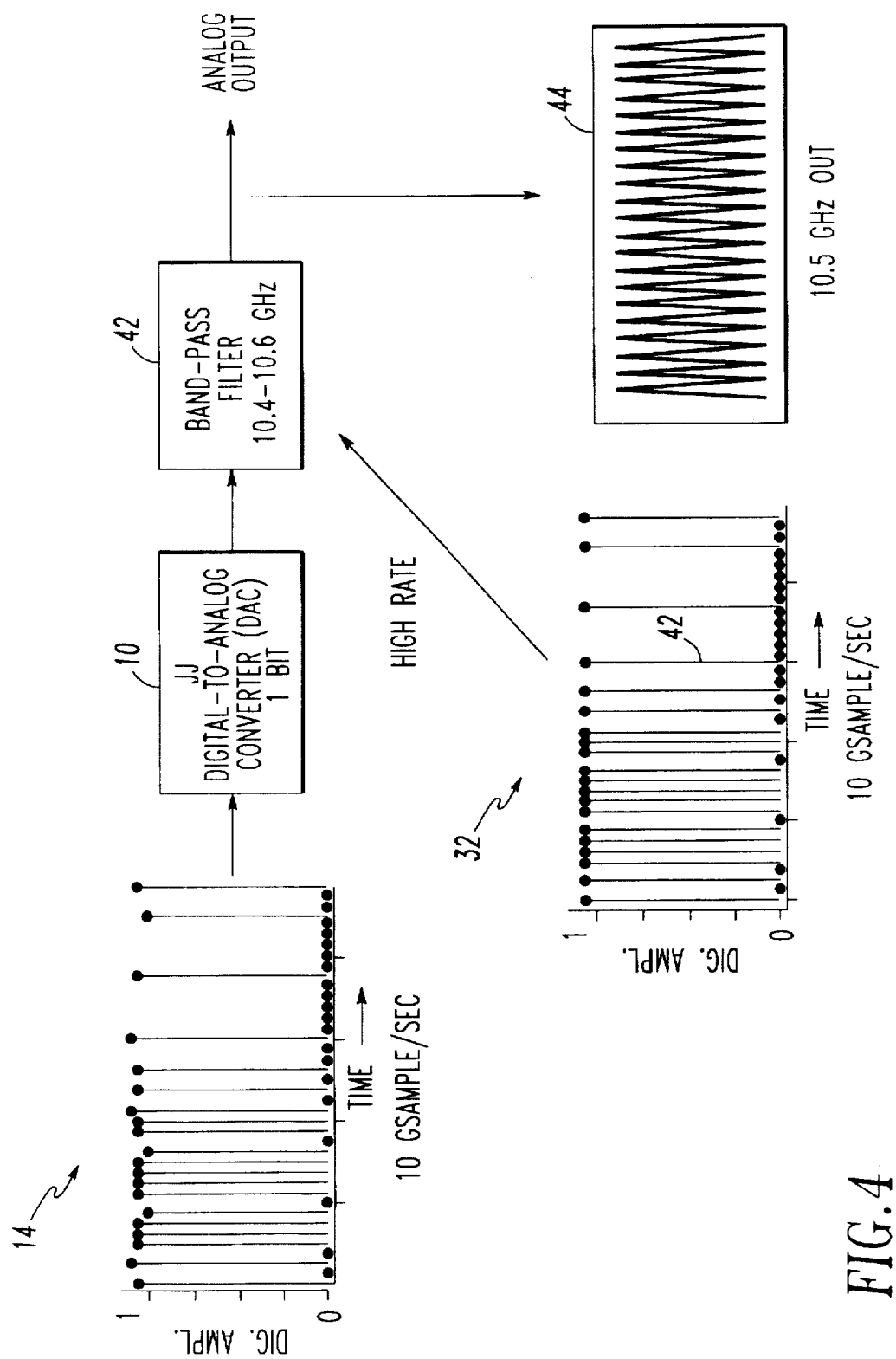
FIG. 4 is a depiction of the manner in which the Josephson junction array shown in FIG. 1 is excited.

Considering now the operation of a Josephson junction circuit configuration as shown in FIGS. 1 and 2, where the exciter circuit 16 comprises, for example, a pulsed pattern generator operating at 10 GHz, a 500 MHz digital waveform can be generated through duty cycle modulation of the 10 GHz exciter signal. As shown in FIG. 4, a pseudo 500 MHz square wave 58 is produced by pulses of digital ONEs 60 of 10 GHz followed by digital ZEROs 62. When the 500 MHz waveform 58 is applied to the Josephson junction array 10, 10 GHz excitation currents 64, 66 are present such as shown in FIG. 5. In FIG. 5, reference numeral 64 denotes 10 GHz excitation current received by the first Josephson junction $32_1$, while reference numeral 66 denotes the same 10 GHz excitation current received by the last Josephson junction $32_n$. Time delayed substantially identical current pulses indicate that a structure such as shown in FIGS. 1 and 3 is free from any strange reflection and resonances.

In the preferred embodiment of the invention shown in FIG. 1, the bandpass filter 28 is comprised of a Chebychev filter having a relatively narrow bandwidth of 400–600 MHz. Accordingly, a 500 MHz output signal 68, such as shown in FIG. 6, will appear across output terminals 70 and 72. The gradual build up of the output signal shown in FIG. 6 illustrates the operation of the narrow bandwidth of the 400–600 MHz Chevychev filter.

Thus what has been shown and described is a Josephson junction structure which exhibits excellent microwave properties and one which responds favorably to a 10 GHz excitation signal. Two key features are present in this invention. First, the embodiment of the invention shown in FIGS. 1 and 3 solves the problem of how to tap a small differential signal from low impedance junctions fabricated on a high impedance microstrip line. Secondly, it proposes a structure for making the low impedance tap using integrated circuit processes which are compatible with high temperature superconductor (HTS) Josephson junction fabrication. Moreover, the output signal power generated at, for example 500 MHz, is substantially the same as would be at DC. The 500 MHz UHF signal produced by the embodiment of the invention shown in FIG. 1, can be furthermore efficiently coupled to a radar transmitter, not shown.

Having thus shown and described what is at present considered to be the preferred embodiment of the invention, it should be noted that the same has been made by way of illustration and not limitation. Accordingly, all modifications, alterations and changes coming within the spirit and scope of the invention as set forth in the appended claims are herein meant to be included.

We claim:

1. Apparatus for generating a low phase-noise RF signal, comprising:

means for exciting a Josephson junction array with an excitation signal;

an array of series connected relatively low impedance Josephson junctions having an input end and an output end;

a relatively low impedance line of metallization located directly above and insulated from said array;

said input end of said array and one end of said line of metallization being commonly connected to said means for exciting the array at a first circuit node;

means coupled to and terminating the output end of the array at a second circuit node;

a relatively high impedance signal filter having a predetermined frequency characteristic for providing an output signal related in frequency to the excitation signal; and an impedance matching transformer including primary and secondary windings, said primary winding being coupled between the other end of said line of metallization and said second circuit node and being responsive to a differential signal appearing across said array of Josephson junctions, said secondary winding being additionally coupled to the signal filter so as to match the impedance of the array to the impedance of the signal filter.

2. Apparatus according to claim 1 wherein said array of Josephson junctions comprises a linear array and wherein said line of metallization is located parallel to said linear array and configured to provide relatively low differential mode inductance and reactively high common mode rejection.

3. Apparatus according to claim 2 wherein said line of metallization has a predetermined length so as to also act as a delay line so that respective signals appearing at the input and output ends of the array of Josephson junctions arrive substantially simultaneously across the primary winding of said transformer.

4. Apparatus according to claim 1 wherein said strip of metallization is relatively narrower in width than with said array of Josephson junctions so that the excitation signal flows through said array rather than said line of metallization.

5. Apparatus according to claim 1 wherein said strip of metallization comprises a length of stripline microwave transmission line.

6. Apparatus according to claim 1 wherein said signal filter comprises a bandpass filter.

7. Apparatus according to claim 6 wherein said excitation signal comprises a digital data stream.

8. Apparatus according to claim 7 wherein said bandpass filter has a predetermined passband and said digital data stream has a frequency which lies in said passband.

9. Apparatus according to claim 8 wherein said digital data signal has a binary ONE portion and a binary ZERO portion, and wherein the binary ONE portion is comprised of a signal which excites said array of Josephson junctions.

10. Apparatus according to claim 9 wherein said signal of said binary ONE portion has a relatively high frequency compared to the frequency of said output signal.

11. Apparatus according to claim 10 wherein said relatively high frequency of said binary ONE portion is at least 10 times greater than the frequency of said output signal.

12. Apparatus according to claim 10 wherein said relatively high frequency of said binary ONE portion is in the GHz range of frequencies and the frequency of said output signal is in the MHz range of frequencies.

13. A method of generating a low phase-noise RF signal, comprising the steps of:

forming an array of Josephson junctions having a low impedance tap extending across the top of the array and being insulated therefrom;

coupling one end of the array and one end of the tap to a Josephson junction excitation source;

coupling the other end of the array and the other end of the tap to mutually opposite ends of a primary winding of a transformer;

coupling a secondary winding of said transformer to a bandpass filter having a predetermined bandpass characteristic;

exciting the array with a signal having a frequency component which is in the passband of said filter; and outputting a signal from the bandpass filter having a frequency corresponding to said frequency component.

14. A method according to claim 13 wherein said step of forming comprises forming a metal line above and parallel to said array of Josephson junctions.

15. A method according to claim 14 wherein said step of forming comprises forming the array of Josephson junctions in a line on a substrate and wherein the width of the metal line is made narrower than the array of Josephson junctions.

16. A method according to claim 15 wherein said metal line is comprised of stripline type of microwave transmission line.

17. A method according to claim 15 wherein said substrate is formed on a ground plane.

18. A method according to claim 13 wherein said step of exciting comprises exciting the array of Josephson junctions with a digital data stream.

19. A method according to claim 18 wherein said digital data stream has a frequency component in the passband of said filter.

20. A method according to claim 19 wherein said frequency component is the frequency of the digital data stream.

21. A method according to claim 19 wherein said digital data stream includes a binary value consisting of multiple cycles of a relatively high frequency signal which excites the array of Josephson junctions, said relatively high frequency signal having a frequency out of the passband of the bandpass filter.

22. A method according to claim 21 wherein the frequency of said digital data stream is in the MHz range and the frequency of said relatively high frequency signal is in the GHz range.

* * * * *